United States Patent
Zhang et al.

(10) Patent No.: US 10,283,829 B2
(45) Date of Patent: May 7, 2019

(54) HIGH-POWER FILTERING SWITCH WITH LOW LOSS AND HIGH ISOLATION BASED ON DIELECTRIC RESONATOR

(71) Applicant: South China University of Technology, Guangzhou, Guangdong (CN)

(72) Inventors: Xiu Yin Zhang, Guangdong (CN); Jin-Xu Xu, Guangdong (CN)

(73) Assignee: South China University of Technology, Guangzhou (CN)

( * ) Notice: Subject to any disclaimer, the term of this patent is extended or adjusted under 35 U.S.C. 154(b) by 120 days.

(21) Appl. No.: 15/678,103

(22) Filed: Aug. 15, 2017

(65) Prior Publication Data
US 2018/0191045 A1    Jul. 5, 2018

(30) Foreign Application Priority Data
Dec. 30, 2016 (CN) .......................... 2016 1 1252956

(51) Int. Cl.
| | |
|---|---|
| *H01P 1/20* | (2006.01) |
| *G01R 33/32* | (2006.01) |
| *H03H 7/06* | (2006.01) |
| *H03H 7/01* | (2006.01) |
| *H01P 1/203* | (2006.01) |
| *H01P 1/208* | (2006.01) |
| *H01P 1/12* | (2006.01) |
| *H01P 7/10* | (2006.01) |

(52) U.S. Cl.
CPC ............ *H01P 1/2002* (2013.01); *G01R 33/32* (2013.01); *H01P 1/2084* (2013.01); *H01P 1/20327* (2013.01); *H03H 7/0153* (2013.01); *H03H 7/06* (2013.01); *H01P 1/127* (2013.01); *H01P 7/10* (2013.01)

(58) Field of Classification Search
CPC .... H01P 1/2002; H01P 1/20327; H01P 1/207; H01P 1/208; H01P 1/2084; H01P 1/2086
USPC ..... 333/202, 207, 209, 212, 219.1, 227, 231
See application file for complete search history.

(56) References Cited

U.S. PATENT DOCUMENTS

2017/0237142 A1* 8/2017 Mansour ............... H01P 1/2002
333/203

* cited by examiner

*Primary Examiner* — Stephen E. Jones

(57) ABSTRACT

A filtering switch based on dielectric resonator is disclosed which comprising a rectangular dielectric resonator, a metal cavity in which the dielectric resonator is located, a switch circuitry and a T-shape feeding line structure. The ON- and OFF-states of the filtering switch based on dielectric resonator are realized by controlling a coupling between the dielectric resonator and the feeding line structure. EM fields of the rectangular dielectric resonator and T-shape feeding line structure have been theoretically analyzed and utilized to guide the coupling control. The results have shown low ON-state loss, high power capability and high OFF-state isolation. Transmission zeros are generated at both sides of the passband by cross coupling between dielectric resonators or between feeding line structures and coupling line structures, resulting in high skirt selectivity.

20 Claims, 13 Drawing Sheets

× ● H-field of dielectric resonator

× ⊘ H-field of T-shape feeding line structure

Central plane

→ E-field of dielectric resonator

→ E-field of T-shape feeding line structure

HIGH-POWER FILTERING SWITCH WITH LOW LOSS AND HIGH ISOLATION BASED ON DIELECTRIC RESONATOR

CROSS REFERENCE TO RELATED APPLICATIONS

The present application claims the benefit of Chinese Patent Application No. 201611252956.6 filed on Dec. 30, 2016. All the above are hereby incorporated by reference.

TECHNICAL FIELD

The present disclosure relates generally to radio frequency technical field, and more particularly, to a high-power filtering switch with low loss and high isolation based on dielectric resonator.

BACKGROUND

Switches and bandpass filters (BPFs) are the basic blocks in many radio frequency (RF) sub-systems, such as the time division duplex (TDD) front-ends. Generally, they are cascaded, thus inter-stage mismatching may exist and thus cause performance degradation. Furthermore, the total loss is the sum of losses of the BPF and the switch, which is usually high. The isolation is often less than 30 dB, because of parasitic parameters of the switching transistors or diodes.

To reduce the loss and improve isolation, filtering single-pole single-throw (SPST) switches are proposed. The ON- and OFF-states are enabled by turning on or off the PIN diodes embedded in filter structures. For example, high-isolation filtering switches can be designed by employing the switchable connected-coupling lines and switchable delay lines, respectively. However, the signals pass through the PIN diodes in the ON-state, which introduces extra insertion loss and reduce the power handling capability. In additional, PIN diodes can be utilized to change the resonant frequencies of the resonators. In this way, high-order BPFs are needed to obtain high OFF-state isolation. Besides filtering SPST switches, the integration of single-pole double-throw (SPDT) switches and BPFs are also demanded and several methods have been proposed to facilitate the co-designs. For example, common resonators are shared by multiple sets of filters for size reduction and performance enhancement. Nevertheless, they suffer from limited power handling capability and thus are not suitable for high-power applications. The technologies used by the filtering switches mentioned above are difficult to realize high selectivity and narrow-band fractional bandwidths (FBWs), for example, less than 2%, due to Q-factor limitations, as most of the applications of the filtering switches are integrated on PCB or IC.

Therefore, a heretofore unaddressed need exists in the art to address the aforementioned deficiencies and inadequacies.

SUMMARY

The primary objective of the present application is to provide a high-power filtering switch with low loss and high isolation based on dielectric resonator, aiming at the technical problems of the filtering switch such as large insertion loss in the ON-state, low OFF-state isolation in the OFF-state, and not being suitable for high-power applications.

In one aspect, the present application relates to a filtering switch based on dielectric resonator comprising a dielectric resonator, a metal cavity in which the dielectric resonator is located, a switch circuitry and a feeding line structure. The feeding line structure includes an input feeding line structure and an output feeding line structure having the same structure placed at different sides of the dielectric resonator. The input feeding line structure and the output feeding line structure each comprises two branch lines and a main line, wherein the two branch lines which are perpendicular to the main line at the center are connected at both ends of the main line. In the present embodiment, one end of one branch line is connected to the metal cavity and grounded, while one end of the other branch line is connected to the switch circuitry for controlling the turning on and off of the switch circuitry, such that ON- and OFF-states of the filtering switch based on dielectric resonator are realized by controlling the coupling between the dielectric resonator and the feeding line structure.

In one preferable embodiment, when one dielectric resonator presents, the input feeding line structure and the output feeding line structure are located at both sides of-one dielectric resonator.

In one preferable embodiment, when two or more dielectric resonators present, the input feeding line structure and the output feeding line structure are located at one side of different dielectric resonators.

In one preferable embodiment, a metal probe is placed between the dielectric resonators for electrical cross coupling.

In one preferable embodiment, the switch circuitry is integrated into a PCB which is embedded in the metal cavity.

In one preferable embodiment, the switch circuitry includes a capacitor, a PIN diode and a resistor. In the present embodiment, the other end of the other branch line is connected to a positive electrode of the PIN diode via the capacitor, the negative electrode of the PIN diode is grounded. Wherein one end of the resistor is connected between the capacitor and the PIN diode, and the other end the resistor is connected to a DC power supply.

In one preferable embodiment, a hole is dug at a center of the dielectric resonator to separate different resonant modes.

In one preferable embodiment, a tuning disk for adjusting resonant frequency is installed above the dielectric resonator.

In one preferable embodiment, numbers of the hole and the tuning disk are the same as the number of the dielectric resonators.

In one preferable embodiment, the dielectric resonator has a symmetric structure comprising a rectangle structure or a cylindrical structure.

In another aspect, the present application relates to a filtering switch based on dielectric resonator comprising a first dielectric resonator, a second dielectric resonator, a third dielectric resonator, a fourth dielectric resonator, a metal cavity, a switch circuitry and a feeding line structure. In the present embodiment, the feeding line structure includes an input feeding line structure placed at a side of the first dielectric resonator and an output feeding line structure placed at a side of the fourth dielectric resonator. In the present embodiment, the input feeding line structure and the output feeding line structure each consists of two branch lines and a main line, wherein the two branch lines which are perpendicular to the main line at the center are connected at both ends of the main line. One end of one branch line in the input feeding line structure is connected to the metal cavity and grounded, and one end of the other branch line in the input feeding line structure is connected to the switch circuitry in the metal cavity. One end of one branch line in the output feeding line structure is connected to the metal cavity and grounded, and one end of the other branch line in the output feeding line structure is connected to the switch circuitry in the metal cavity for controlling the turning on and off of the switch circuitry. Such that the ON- and OFF-states of the filtering switch based on dielectric resonator are realized by controlling the coupling between dielectric resonators and the feeding line structure.

In one preferable embodiment, the switch circuitry comprises two switch circuitry parts having the same structure and being symmetric with respect to a center plan.

In a further aspect, the present application relates to filtering switch based on dielectric resonator comprising a metal cavity, a fifth dielectric resonator, a sixth dielectric resonator, a seventh dielectric resonator, a switch circuitry, a first coupling line structure and a second coupling line structure. In the present embodiment, the seventh dielectric resonator, the fifth dielectric resonator, and the sixth dielectric resonator are arranged in the metal cavity one after another. In the present embodiment, the first coupling line structure is placed between the fifth dielectric resonator, and the sixth dielectric resonator, while the second coupling line structure is placed between the fifth dielectric resonator and the seventh dielectric resonator. Both of the first coupling line structure and the second coupling line structure comprise a main coupling line, a first branch coupling line, and a second branch coupling line, wherein one end of the first branch coupling line and the second branch coupling line is connected to both ends of the main coupling line and perpendicular to the main coupling line, and the other end of the first branch coupling line is grounded while the other end of the second branch coupling line is connected to the switch circuit. In the present embodiment, the first branch coupling lines and the second branch coupling lines are coupled to the fifth dielectric resonator, the main line of the first coupling line structure is coupled to the sixth dielectric resonator, the main line of the second coupling line structure is coupled to the seventh dielectric resonator. In one preferable embodiment, the other end of the first branch coupling line is connected to the paralleled inductor and capacitor and then grounded.

In one preferable embodiment, the main coupling line has a bended structure which is consisted of a transverse line and a vertical line which are perpendicular to each other, wherein the transverse line is connected to the one end of the first branch coupling line and the second branch coupling line.

In one preferable embodiment, the filtering switch based on dielectric resonator further comprises a first input feeding line arranged at one side of the fifth dielectric resonator, a first output feeding line arranged at one side of the sixth dielectric resonator, and a second output feeding line arranged at one side of the seventh dielectric resonator.

In one preferable embodiment, the switch circuitry includes a capacitor, a PIN diode and a resistor, wherein the other end of the second branch line is connected to a positive electrode of the PIN diode via the capacitor, the negative electrode of the PIN diode is grounded, one end of the resistor is connected between the capacitor and the PIN diode, and the other end the resistor is connected to a DC power supply.

In one preferable embodiment, a hole is dug at a center of at least one of the fifth dielectric resonator, the sixth dielectric resonator and the seventh dielectric resonator to separate different resonant modes.

In one preferable embodiment, a tuning disk for adjusting resonant frequency is installed above at least one of the fifth dielectric resonator, the sixth dielectric resonator and the seventh dielectric resonator to adjust the resonant frequency.

In one preferable embodiment, the numbers of the hole and the tuning disk are all three.

In one preferable embodiment, the dielectric resonator has a symmetric structure comprising a rectangle structure or a cylindrical structure.

These and other aspects of the present application will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE PREFERRED EMBODIMENT

Figure 1:
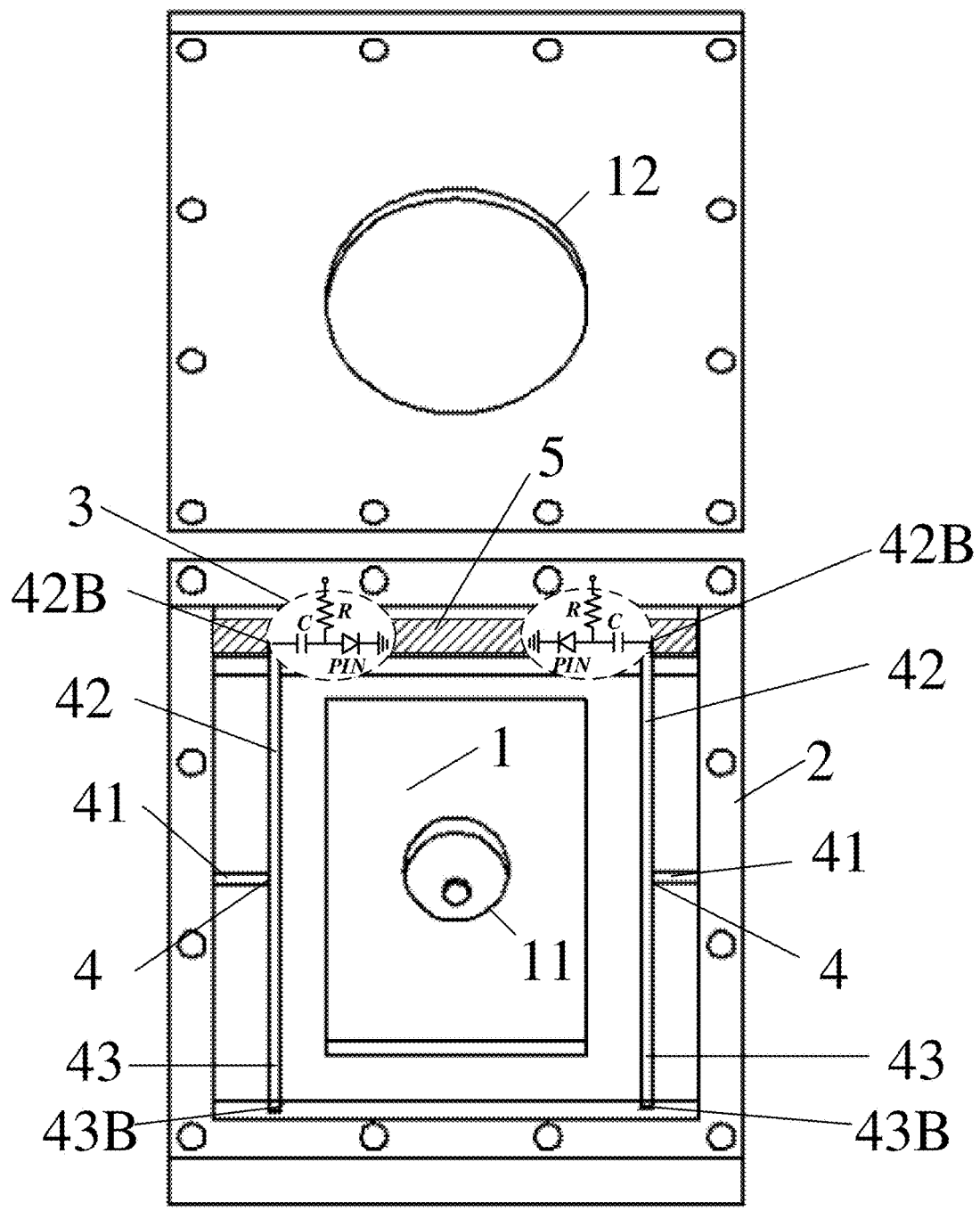
FIG. 1 shows a structural diagram of the filtering switch based on dielectric resonator according to one embodiment of the present application.

The present application is more particularly described in the following examples that are intended as illustrative only since numerous modifications and variations therein will be apparent to those skilled in the art. Various embodiments of the invention are now described in detail. Referring to the drawings, like numbers indicate like components throughout the views.

As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

As used herein, "around", "about" or "approximate" shall generally mean within 10 percent, preferably within 5 percent, and more preferably within 3 percent of a given value or range. Numerical quantities given herein are approximate, meaning that the term "around", "about" or "approximate" can be inferred if not expressly stated.

As used herein, the terms "comprising," "including," "having," "containing," "involving," and the like are to be understood to be open-ended, i.e., to mean including but not limited to.

The description will be made as to the embodiments of the present application in conjunction with the accompanying drawings in FIGS. 1-15B. In accordance with the purposes of this disclosure, as embodied and broadly described herein, this disclosure, in one aspect, relates to a high-power filtering switch with low loss and high isolation based on dielectric resonator.

Referring now to FIG. 1, a filtering switch based on dielectric resonator with high-power, low loss and high isolation is shown according to one embodiment of the present application. As shown in FIG. 1, the filtering switch based on dielectric resonator includes a dielectric resonator 1, a metal cavity 2 in which the dielectric resonator 1 is located, a switch circuitry 3 and a feeding line structure 4. The switch circuitry 3 is integrated in a PCB5 which is embedded in the metal cavity 2. The feeding line structure 4 having a T-shape includes an input feeding line structure and an output feeding line structure having the same structure. Each of the input feeding line structure and output feeding line structure comprises two branch lines 42, 43 and a main line 41, respectively. The two branch lines 42, 43 which are perpendicular to the main line 41 at the center are connected at both ends of the main line 41. One end 43B of one branch line 43 is connected to the metal cavity 2 and grounded, while one end 42B of the other branch line 42 is connected to the switch circuitry 3 in the metal cavity 2. The main line 41 is located at a central point on one side of the coupled dielectric resonator.

When one dielectric resonator presents, the input feeding line structure and the output feeding line structure are located at both sides of one dielectric resonator. When more than two dielectric resonators present, the input feeding line structure and the output feeding line structure are located one side of different dielectric resonators.

When three or more dielectric resonators present, a metal probe is placed between the dielectric resonators for electrical cross coupling.

Furthermore, to enable the integration of switch circuitry 3 including the capacitor C, PIN diode and resistor R, PCB5 is embedded in the metal cavity 2. The end 42B of the branch line 42 is connected to a positive electrode of the PIN diode via the capacitor C. The negative electrode of the PIN diode is grounded. One end of the resistor R is connected between the capacitor C and the PIN diode, and the other end the resistor R is connected to a DC power supply.

Figure 2:
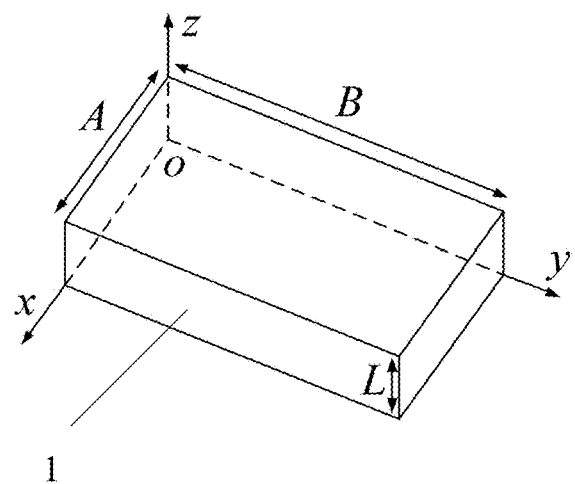
FIG. 2 shows a structural diagram of a rectangular dielectric resonator.

In a proposed high-power filtering switch with low loss and high isolation based on dielectric resonator, a dielectric resonator can be employed with 3-dimension structural shown in FIG. 2. The A, B and L are the length, width and height, respectively. There are lots of modes resonating at different frequencies. Due to the regular distribution of EM fields, the $TE_{mn(s+\delta)}$ and $TM_{mn(s+\delta)}$ are most popularly used, where in, n and s are the numbers of half wave inside of the dielectric resonator along the x, y and z directions, and $0<\delta<1$. Generally, when a small ratio $L/(A+B)$ is chosen, the dominate mode of the rectangular dielectric resonator is the $TE_{11\delta}$ mode, which is used in the proposed designs. For the $TE_{mn(s+\delta)}$ mode, the EM fields can be calculated by the Hybrid Magnetic Wall Method based on Helmholtz Equation and boundary conditions as follows:

$$\begin{cases} E_x = -\frac{j\omega\mu_0}{k^2+\gamma_z^2}\frac{\partial H_z}{\partial y}, & E_y = \frac{j\omega\mu_0}{k^2+\gamma_z^2}\frac{\partial H_z}{\partial x}, \\ H_x = -\frac{1}{k^2+\gamma_z^2}\frac{\partial^2 H_z}{\partial x\partial z}, & H_y = \frac{1}{k^2+\gamma_z^2}\frac{\partial^2 H_z}{\partial y\partial z}, \end{cases}$$

-continued $$H_z = \begin{cases} A_1 \sin k_x x \cdot \sin k_y y \cdot \sin(k_z z + \varphi) & 0 \le z \le L \\ A_2 \sin k_x x \cdot \sin k_y y \cdot e^{-\alpha_z(z-L)} & z \ge L \\ A_3 \sin k_x x \cdot \sin k_y y \cdot e^{\alpha_z z} & z \le 0 \end{cases}$$

where $$k_x^2 + k_y^2 + k_z^2 = \varepsilon_r k_0^2 \quad 0 \le z \le L$$

$$k_x^2 + k_y^2 + \alpha_z^2 = k_0^2 \quad z \ge L \,\&\, z \le 0$$

$$k_x = m\pi/A, \quad k_y = n\pi/B, \quad k_z = (s+\delta)\pi/L$$

$$\varphi = \frac{\pi}{2} - \tan^{-1}\left(\frac{\alpha_z}{k_z}\right)$$

Where k is wave number at operation frequency, $\gamma_z$ is the propagation constant along z-direction, $\mu_0$ is the permeability in vacuum, and $\varepsilon_r$ is the relative permittivity of the dielectric resonator.

Figure 3A:
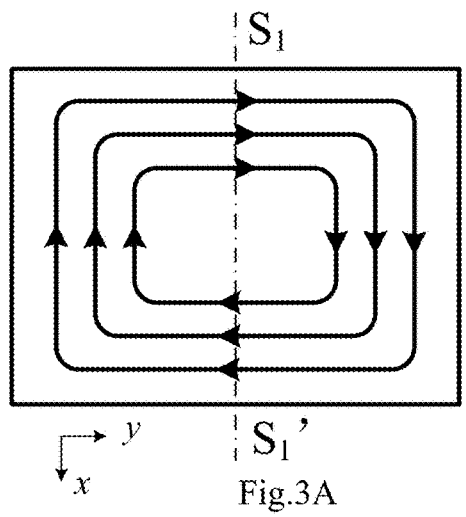
FIG. 3A shows E-filed vector distribution of the $TE_{11\delta}$-mode rectangular dielectric resonator in x-y plan.
Figure 3B:
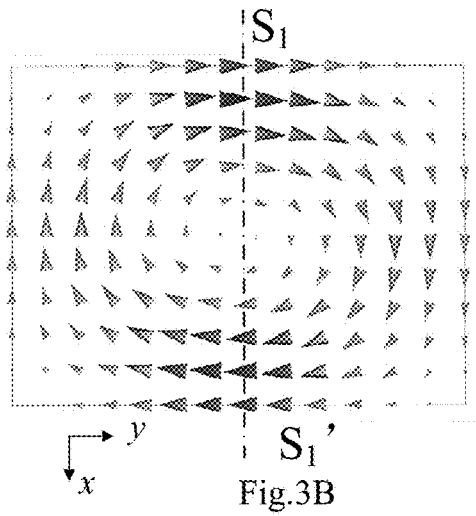
FIG. 3B shows E-filed magnitude distribution of the $TE_{11\delta}$-mode rectangular dielectric resonator in x-y plan.
Figure 3C:
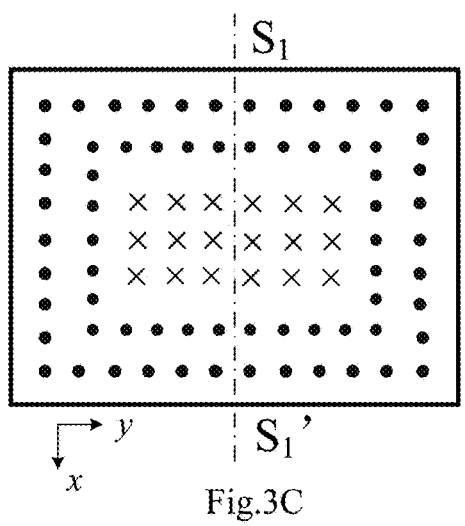
FIG. 3C shows H-filed vector distribution of the T $TE_{11\delta}$-mode rectangular dielectric resonator in z=L/2 plan.
Figure 3D:
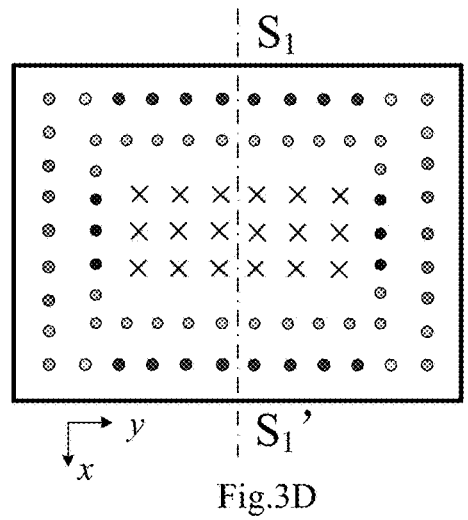
FIG. 3D shows H-filed magnitude distribution of the $TE_{11\delta}$-mode rectangular dielectric resonator in z=L/2 plan.

FIG. 3A-3D show EM filed distributions of the $TE_{11\delta}$-mode rectangular dielectric resonator. From the EM fields in x-y plane shown in FIGS. 3A-3B, it can be observed that the vector of electric field (E-field) is symmetric with respect to the center plane $S_1$-$S_1'$, where arrows represent the strongest density. FIGS. 3C-3D illustrate the magnetic field (H-field) at the plane of z=L/2, where the H-field is perpendicular to this plane and symmetric with respect to the center plane $S_1$-$S_1'$.

A hole 11 is dug at the center of the dielectric resonator to separate different resonant modes. Tuning disks 12 for adjusting the resonant frequency are installed above the dielectric resonator. The numbers of the hole 11 and the tuning disk are the same as the number of the dielectric resonator.

The ON- and OFF-states of the proposed filtering switches are realized by controlling the coupling between the dielectric resonator and the T-shape feeding line structure 4. In the ON-state, the coupling coefficient is adjusted to obtain the desired bandpass responses. In the OFF-state, it is manipulated as zero for realizing high isolation.

In the high-power filtering switch with low loss and high isolation based on dielectric resonator provided by the present application, in the ON-state, the PIN diode is turned off and no signals can pass through the switch circuit, such that no extra insertion loss is induced, and the power handling capability is the same as a dielectric filter and never reduced. In the OFF-state, the isolation capability is improved as the ON- and OFF-states are realized by controlling the coupling between the dielectric resonator and the T-shape feeding line structure 4 rather than only switching on and off the diodes or transistors.

To realize the desired coupling in the ON- and OFF-states, the feeding line structure having a T-shape consists of two branch lines with the main line at the center. One end of the two branch lines is perpendicular to and connected at both ends of the main line. Wherein, the other end of one branch line connected to the metal cavity and grounded, is short-circuited, while the other end of the one branch line connected to the switch circuitry is short- or open-circuited which determines the states of the high-power filtering switch with low loss and high isolation based on dielectric resonator according the present embodiment.

When signals are transmitted in the branch lines, the transmission mode is similar to that in the coaxial line. According to the transmission line theory, the normalized voltage and current distributions on the two branch lines ($I_1/U_1$ and $I_2/U_2$) are expressed as 1) With two short ends:

$$\begin{cases} I_1 = I_L \cos(\beta(y+l)), \, U_1 = jI_L Z_C \sin(\beta(y+l)), & y < 0 \\ I_2 = I_L \cos(\beta(y-l)), \, U_2 = jI_L Z_C \sin(\beta(y-l)), & y > 0 \end{cases}$$

2) With one short end and one open end:

$$\begin{cases} I_1 = I_L \cos(\beta(y+l)), \, U_1 = jI_L Z_C \sin(\beta(y+l)), & y < 0 \\ I_2 = I_L \cos(\beta(y+l)), \, U_2 = jI_L Z_C \sin(\beta(y+l)), & y > 0 \end{cases}.$$

Where $I_L$ is the current at the short end of the metal probe, $Z_c$ and $\beta$ denote the characteristic impedance and propagation constant, respectively.

Figure 4:
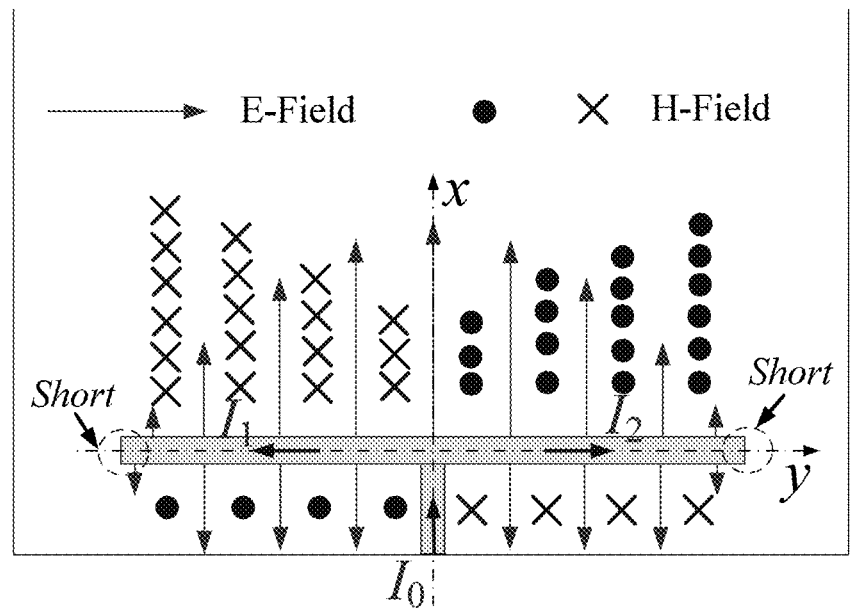
FIG. 4 shows the EM fields at x-y plane when two branch lines are short.

According to the above voltage and current equations, the EM fields can be studied. For easy analysis, the effect of main line on the EM field distribution is ignored because of the short electric length. FIG. 4 shows the EM fields at x-y plane when two branch lines are short. It can be observed that the E-field is symmetric with respect to x-axis. As for the H-field, it is out-of-phase at two sides of x-axis. When one of the branch line is short-circuited and the other is open-circuited, the current and voltage at two sides of $S_1$-$S_1'$ are asymmetric. Thus, both E- and H-fields are asymmetric.

Figure 5A:
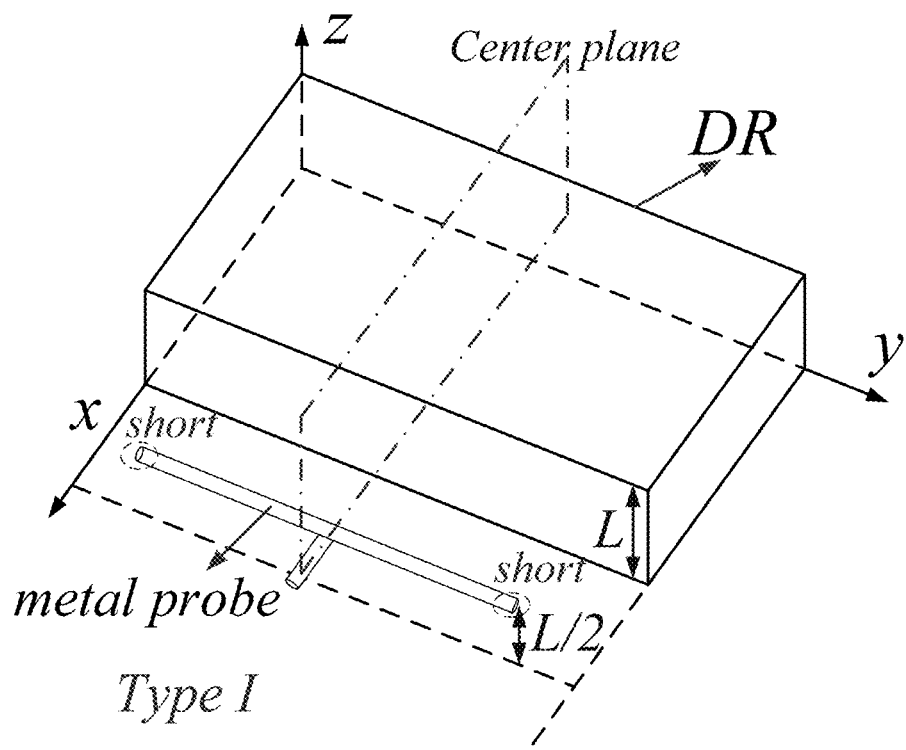
FIG. 5A shows the Type I coupling scheme between a rectangular dielectric resonator and the T-shape feeding line structure.

FIG. 5A shows the Type I coupling scheme between a rectangular dielectric resonator and the T-shape feeding line structure. The branch lines of the T-shape feeding line structure with two short ends are coupled to the rectangular dielectric resonator, which is symmetric with respect to the center plane in FIG. 5A. To clarify the mechanism of coupling control, the coupling coefficient (k) between the dielectric resonator and the feeding line structure is studied, which can be expressed by the electric and magnetic coupling coefficients ($k_e$ and $k_m$) as $$k = k_e - k_m$$

The $k_e$ and $k_m$ above can be defined on the basis of the ratio of coupled energy to stored energy as $$k_e = \frac{\iiint \varepsilon \overline{E_1} \cdot \overline{E_2} \, dv}{\sqrt{\iiint \varepsilon |\overline{E_1}|^2 dv \times \iiint \varepsilon |\overline{E_2}|^2 dv}}$$

$$k_m = \frac{\iiint \mu \overline{H_1} \cdot \overline{H_2} \, dv}{\sqrt{\iiint \mu |\overline{H_1}|^2 dv \times \iiint \mu |\overline{H_2}|^2 dv}}$$

Where $\overline{E}$ and $\overline{H}$ represent the electric and magnetic field vectors, and v is volume.

Figure 6A:
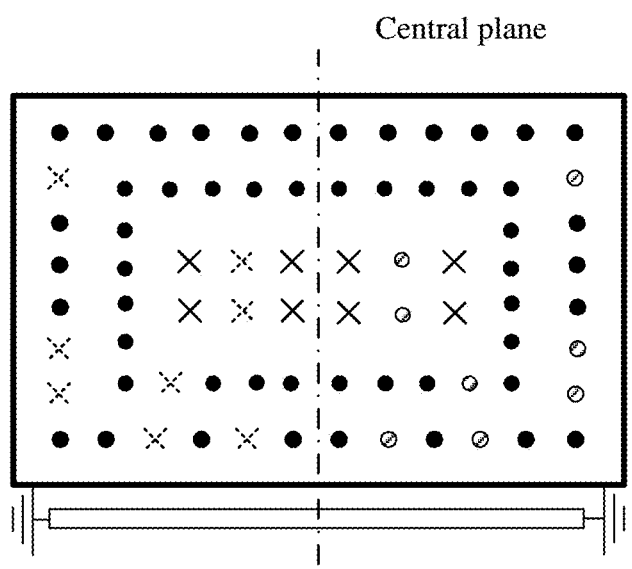
FIG. 6A shows parts of the H-fields at the coupling regions for Type I coupling scheme.
Figure 6B:
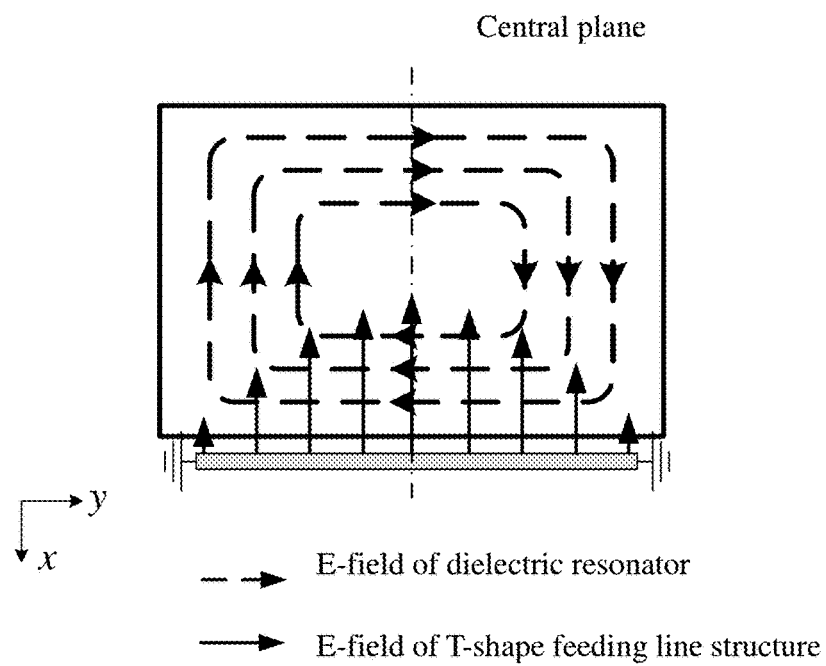
FIG. 6B shows parts of the E-fields at the coupling regions for Type I coupling scheme.

For easy analysis, parts of the H-fields at the coupling regions in the plane of z=L/2 are illustrated in FIG. 6A. Based on the analysis above, it can be known that the H-field of the dielectric resonator is symmetric with respect to the center plane. As for the H-field of the T-shape feeding line structure, it is out-of-phase at two sides of the center plane. Thus, the $k_m$ of Type I ($k_{m1}$) is calculated as zero, namely, $k_{m1}$=0. The E-field is shown in FIG. 6B. The E-field of the T-shape feeding line structure is symmetric with respect to the center plane. However, the E-field of the dielectric resonator at x-axis is out-of-phase at two sides of the center plane. Thus, $k_e$ for Type I ($k_{e1}$) is zero, namely, $k_{e1}=0$. Accordingly, $k_1$ is equal to zero, namely, $k_1=k_{e1}-k_{m1}=0$.

Figure 5B:
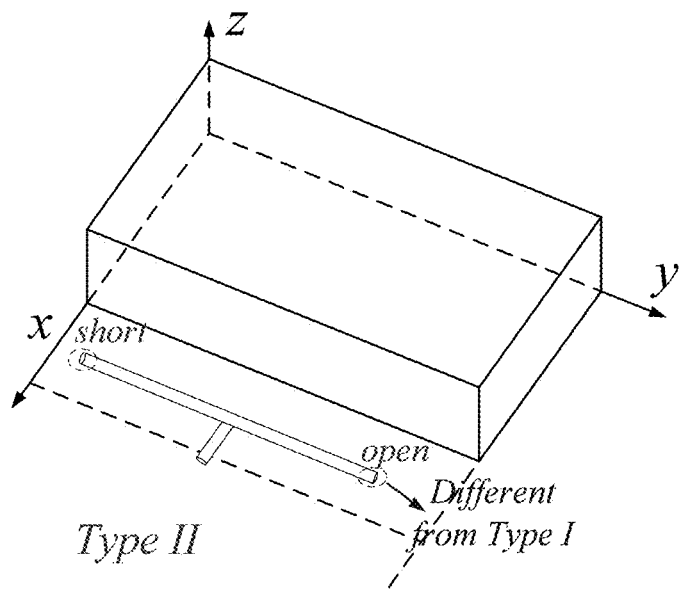
FIG. 5B shows the Type II coupling scheme between a rectangular dielectric resonator and the T-shape feeding line structure.

FIG. 5B shows the Type II coupling scheme between a rectangular dielectric resonator and the T-shape feeding line structure, where one end of branch lines is short-circuited and the other end is open-circuited. Similar to Type I, the k of Type II ($k_2$) can also be analyzed. When the T-shape feeding line structure is asymmetric, the E-field and H-field of the T-shape feeding line structure are asymmetric. According to the EM fields of the dielectric resonator and the equations above, it can be known that $k_2$ is nonzero, namely, $k_2 \neq 0$. The value of $k_2$ can be controlled by the distance between the dielectric resonator and T-shape feeding line structure in Type II.

Figure 7:
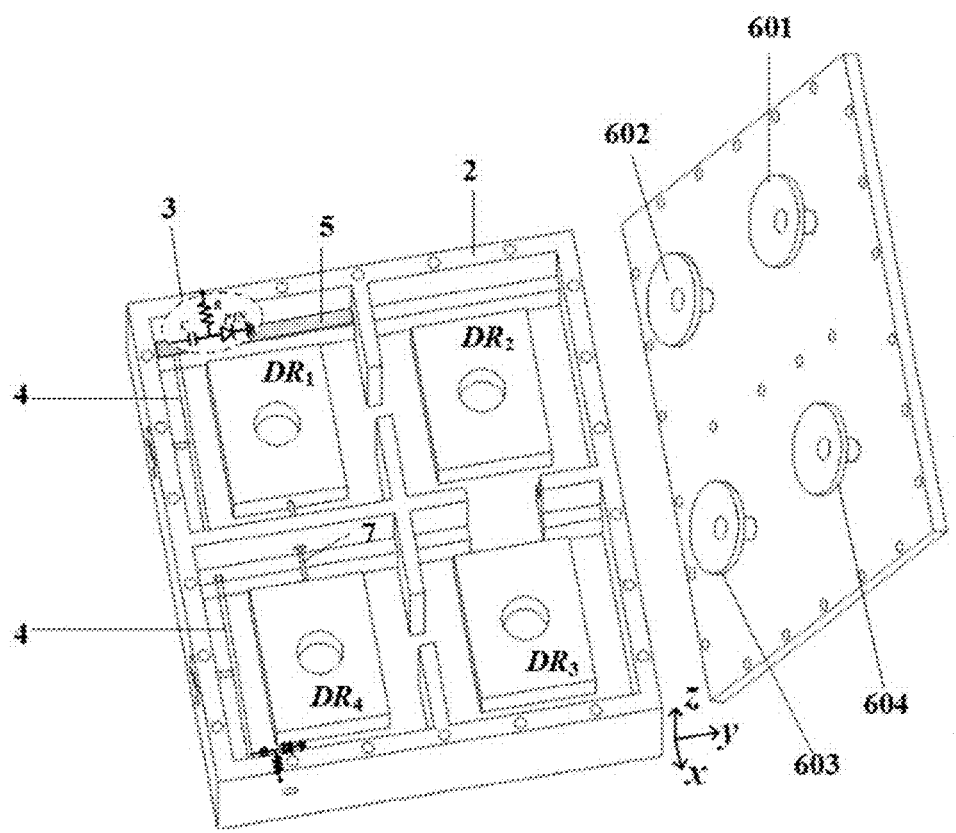
FIG. 7 shows a fourth-order single-pole single-throw filtering switch based on dielectric resonator according to one embodiment of the present application.

FIG. 7 shows a narrow-band fourth-order dielectric resonator single-pole single-throw filtering switch according to one embodiment of the present application, which comprising a metal cavity 2, a first dielectric resonator $DR_1$, a second dielectric resonator $DR_2$, a third dielectric resonator $DR_3$, a fourth dielectric resonator $DR_4$, a switch circuitry 3 and a feeding line structure 4 including an input feeding line structure and an output feeding line structure. The dielectric resonators $DR_1$-$DR_4$ are all rectangular dielectric resonators provided with holes at the center to separate the $TE_{11\delta}$ and $TM_{11\delta}$ modes. Tuning disks 601-604 are installed above the dielectric resonators $DR_1$-$DR_4$ for resonant frequencies tuning.

The input and output feeding line structures can have the same shape and connection manner. The input feeding line structure is placed at a side of the first dielectric resonator $DR_1$ and the output feeding line structure is placed at a side of the fourth dielectric resonator $DR_4$. The input feeding line structure and the output feeding line structure each consists of two branch lines and a main line, wherein the two branch lines which are perpendicular to the main line at the center are connected at both ends of the main line. One end of one branch line in the input feeding line structure is connected to the metal cavity 2 and grounded, and one end of the other branch line is connected to the switch circuitry 3 in the metal cavity 2. One end of one branch line in the output feeding line structure is connected to the metal cavity 2 and grounded, and one end of the other branch line in the output feeding line structure is connected to the switch circuitry 3 in the metal cavity 2.

To enable the integration of switch circuitry 3 including the capacitors C, PIN diodes and resistors R, PCBs are embedded in the metal cavity 2, as shown in FIG. 7. The switch circuitry parts at the input side and the output side have the same structure and are symmetric with respect to the center plan. A metal probe 7 is placed between dielectric resonators $DR_1$-$DR_4$ to provide electric cross coupling.

When the PIN diodes in FIG. 7 are turned on, the single-pole single-throw filtering switch is in the OFF-state, as analyzed below. One end of the input feeding line structure connected to the metal cavity is short-circuited. The other end connected by the switch circuitry is regarded as short-circuited, because the PIN diodes are turned on. It should be noted that there exists capacitance effect introduced by the switch circuitry, which increases the effective length of one end of the input feeding line. For this reason, the other end of the input feeding line connected to the metal cavity is slightly extended to compensate the capacitance effect. Accordingly, the input feeding line with two short ends is nearly symmetric with respect to the center plane. Thus, the coupling between the input feeding line and the first dielectric resonator DR1 is the same as that of Type I above. Based on the analysis above, the coupling strength is zero. Similarly, the coupling between the output feeding line and the fourth dielectric resonator $DR_4$ is the same as that of Type I above, which is zero, too. Accordingly, signals at $TE_{11\delta}$ cannot be delivered from one port 1 to the other port 2, resulting in high OFF-state isolation.

When the PIN diodes in FIG. 7 are turned off, the dielectric resonator single-pole single-throw filtering switch is in the ON-state. The end of the input feeding line connected by the switch circuitry is open-circuited, while the other end connected to the metal cavity is short-circuited. Since no signals pass through the switch circuitry, the filtering switch is the same as a BPF. Thus, the power handling capability is the same as a dielectric filter. Moreover, the classical filter synthesis method can be adopted as presented below.

Since the feeding line structure with open and short ends is asymmetric, the coupling between the input (output) feeding line and the first or fourth dielectric resonator $DR_1$ or $DR_4$ is the same as that of Type II. Thus, the coupling strength between the feeding lines and dielectric resonators can be controlled to obtain the desired input and output external quality factors. In this design, the passband is centered at 1.832 GHz with the fractional bandwidth (FBW) of 0.65%. The return loss is set to be better than 20 dB. Two transmission zeros are appointed at 1.8 GHz and 1.865 GHz. Based on the structure in FIG. 7, the N+2 order coupling matrix is synthesized as:

$$M_{N+2} = \begin{bmatrix} 0 & 1.0343 & 0 & 0 & 0 & 0 \\ 1.0343 & 0 & -0.9083 & 0 & 0.0117 & 0 \\ 0 & -0.9083 & 0 & -0.7046 & 0 & 0 \\ 0 & 0 & -0.7046 & -0.0001 & -0.9083 & 0 \\ 0 & 0.0117 & 0 & -0.9083 & 0 & 1.0343 \\ 0 & 0 & 0 & 0 & 1.0343 & 0 \end{bmatrix}$$

The desired coupling coefficient k and external quality factor $Q_e$ can be calculated by $$k_{ij} = FBW \times M_{ij}$$

$$Q_e = \frac{1}{FBW \times M_{S1}^2}.$$

Hence, the parameters can be calculated as follows: $k_{12}=k_{34}=0.0059$, $k_{23}=0.0046$, $k_{14}=0.0000765$, $Q_e=143.8$. Consequently, the design parameters of the dielectric resonator single-pole single-throw filtering switch can be determined following the classical filter design theory.

The substrate of dielectric resonators has the dielectric constant of 36.5 and the loss tangent of $2 \times 10^{-5}$. The PIN diodes used in the design are SMP 1302-085LF from Skyworks. The simulation and measurement are carried out by using the high frequency structure simulator (HFSS) and Agilent 8753ES network analyzer, respectively.

Figure 8A:
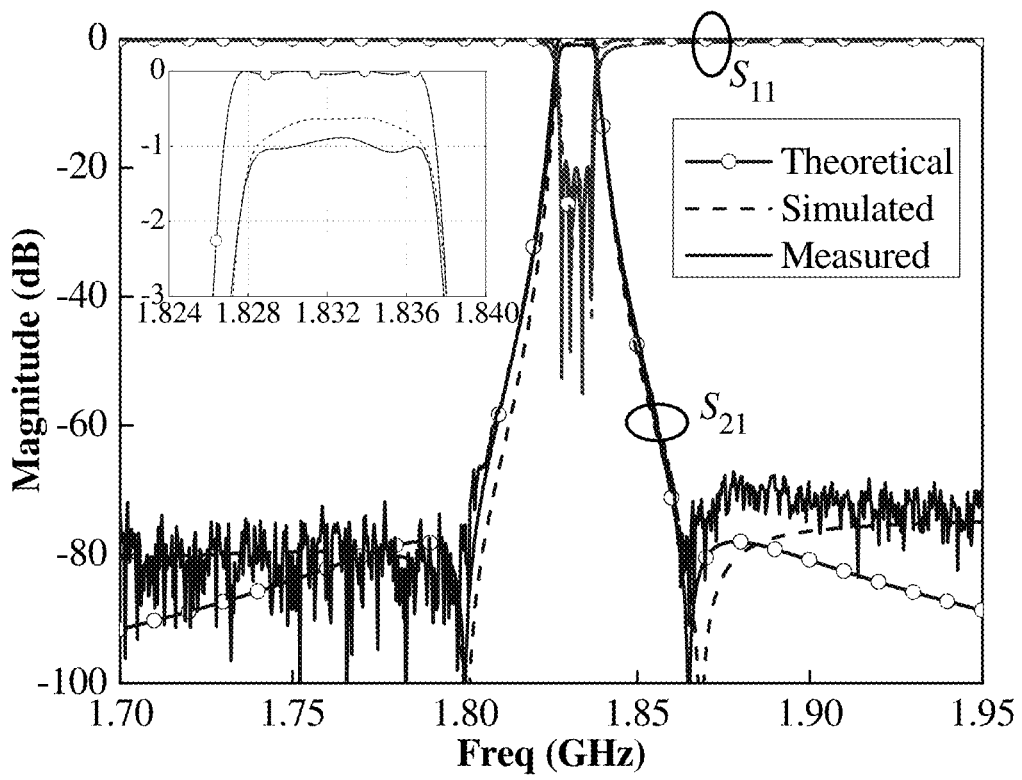
FIG. 8A shows theoretical, simulated and measured ON-state responses of the fourth-order single-pole single-throw filtering switch based on dielectric resonator in FIG. 7.
Figure 8B:
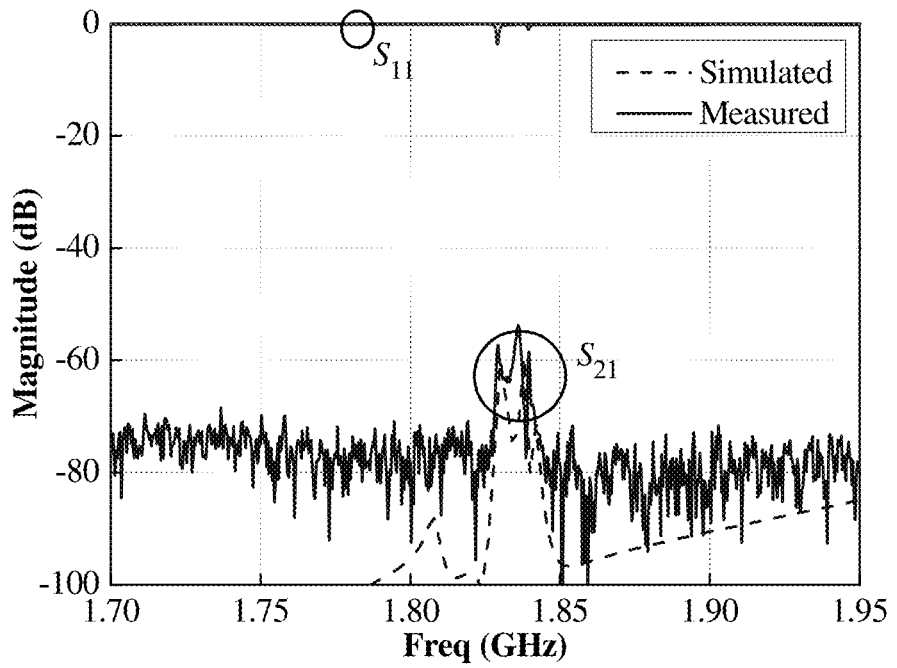
FIG. 8B shows simulated and measured OFF-state responses of the fourth-order single-pole single-throw filtering switch based on dielectric resonator in FIG. 7.
Figure 8C:
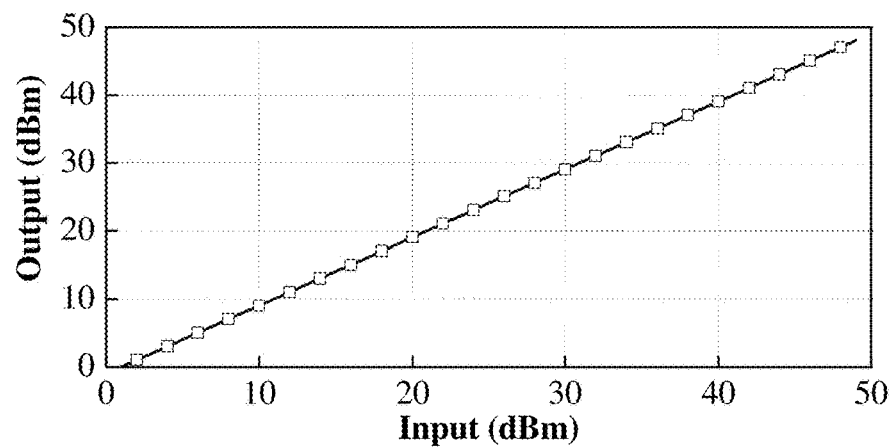
FIG. 8C shows measured output power versus input power in the ON-state of the fourth-order single-pole single-throw filtering switch based on dielectric resonator in FIG. 7.

Good agreement between theoretical, simulated and measured ON-state responses is observed in FIG. 8A. The simulated and measured OFF-state responses are also observed in FIG. 8B. The measured passband is centered at 1.832 GHz with the 3-dB FBW of 0.64%. The insertion loss at the center frequency is less than 1 dB. The return loss is better than 20 dB. The out-of-band rejection levels are more than 68 dB. Two transmission zeros appear at 1.8 and 1.865 GHz, which greatly enhance the skirt selectively. Since no signals pass through the PIN diodes in the ON-state, the filtering switch can handle high power, as shown in FIG. 8C. In the measurement, the reverse biases of −65V are applied to the PIN diodes. It can be seen that the input $P_{1dB}$ is larger than 49 dBm, which means that the presented narrow-band fourth-order dielectric resonator single-pole single-throw filtering switch can be used in high power systems. In the OFF-state, the isolation is better than 53 dB within the measured frequency range from 1.7 GHz to 1.95 GHz. Good performance of the low ON-state loss, high power handling capability and high OFF-state isolation verifies the proposed idea.

Figure 9A:
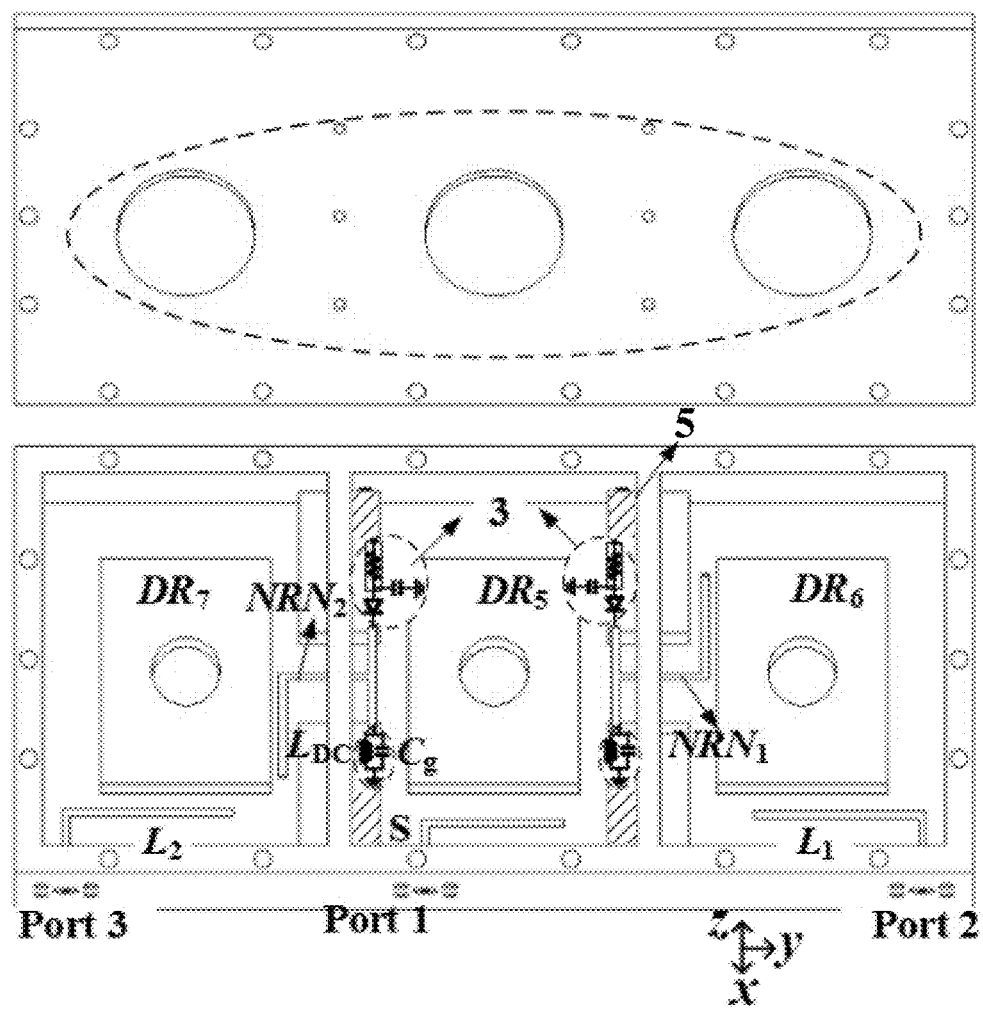
FIG. 9A shows a single-pole double-throw filtering switch based on dielectric resonator according to one embodiment of the present application.

FIG. 9A shows a single-pole double-throw filtering switch based on dielectric resonator according to one embodiment of the present application, which comprising a metal cavity, a switch circuitry, three dielectric resonators $DR_5$-$DR_7$, two coupling line structures $NRN_1$ and $NRN_2$ and three input and output feeding lines S, $L_1$ and $L_2$. The seventh dielectric resonator $DR_7$, the fifth dielectric resonator $DR_5$, and the sixth dielectric resonator $DR_6$ are arranged in the metal cavity one after another. The first coupling line structure $NRN_1$ is placed between the fifth dielectric resonator $DR_5$, and the sixth dielectric resonator $DR_6$, while the second coupling line structure $NRN_2$ is placed between the fifth dielectric resonator $DR_5$, and the seventh dielectric resonator $DR_7$. Both the first and second coupling line structures $NRN_1$ and $NRN_2$ are composed of a main coupling line and two branch coupling lines. The main coupling line has a bended structure which is consisted of a transverse line and a vertical line which are perpendicular to each other. The transverse line is connected to one end of the two branch coupling lines. One end of the first branch coupling line and the second branch coupling line is connected to both ends of the main coupling line and perpendicular to the main coupling line. The other end of the first branch coupling line is grounded while the other end of the second branch coupling line is connected to the switch circuit. In the preferable embodiment of the present application, the other end of the first branch coupling line is connected to the paralleled inductor and capacitor and then grounded. The capacitor is used to compensate the capacitance effect of switch circuitry and the inductor provides the ground to the bias circuitry of the PIN diode. The first branch coupling lines and the second branch coupling lines are coupled to the fifth dielectric resonator $DR_5$, the main line of the first coupling line structure is coupled to the sixth dielectric resonator $DR_6$, the main line of the second coupling line structure is coupled to the seventh dielectric resonator $DR_7$.

The first input feeding line S is arranged at one side of the fifth dielectric resonator $DR_5$, the first output feeding line $L_1$ is arranged at one side of the sixth dielectric resonator $DR_6$, and the second output feeding line $L_2$ is arranged at one side of the seventh dielectric resonator $DR_7$.

The switch circuitry 3 includes the capacitor C, PIN diode and resistor R. The other end of the second branch line is connected to a positive electrode of the PIN diode via the capacitor, while the negative electrode of the PIN diode is grounded. One end of the resistor is connected between the capacitor and the PIN diode, and the other end the resistor is connected to a DC power supply.

Figure 9B:
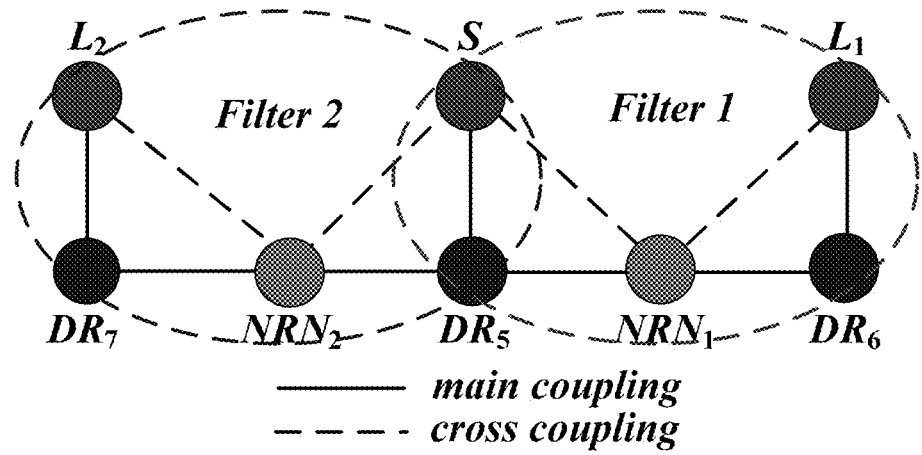
FIG. 9B shows a topology structure of the single-pole double-throw filtering switch based on dielectric resonator shown in FIG. 9A.

FIG. 9B shows a topology structure of the single-pole double-throw filtering switch based on dielectric resonator shown in FIG. 9A. Cross coupling exists between the input and output feeding lines and the coupling line structures. By using the common first input feeding line S and the fifth dielectric resonator $DR_5$, the total circuitry can be divided into two filters, namely, Filter 1 and Filter 2, as enclosed in FIG. 9B, respectively. By controlling the PIN diodes in the first and second coupling line structures $NRN_1$ and $NRN_2$, the circuitry can work in two states, namely, State 1 (Filter 1 is ON and Filter 2 is OFF) and State 2 (Filter 1 is OFF and Filter 2 is ON).

When the PIN diode in the second coupling line structure $NRN_2$ is turned on and that in the first coupling line structure $NRN_1$ is turned off, the single-pole double-throw filtering switch based on dielectric resonator of the present embodiment is in state 1, namely, Filter 1 is ON and Filter 2 is OFF. The mechanism is detailed as follows. The inductors $L_{DC}$ for providing DC path can be ignored at the operating frequency. In this case, when the PIN diode in the second coupling line structure $NRN_2$ is on, the ends of two branch lines in the second coupling line structure $NRN_2$ are shorted to the ground. Thus, the branch lines of the second coupling line structure $NRN_2$ are symmetric. Based on the analysis above, the coupling between the fifth dielectric resonator $DR_5$ and the second coupling line structure $NRN_2$ is the same as that of Type I. The resultant coupling coefficient is zero. Meanwhile, the cross coupling between the first input and output feeding line S and the third input and output feeding line $L_2$ is very weak. Therefore, signals cannot be transferred from first input feeding line S to the second output feeding line $L_2$. Thus, Filter 2 is OFF and high isolation from the first input feeding line S to the second output feeding line $L_2$ and from the first output feeding line $L_1$ to the second output feeding line $L_2$ can be obtained.

Figure 10A:
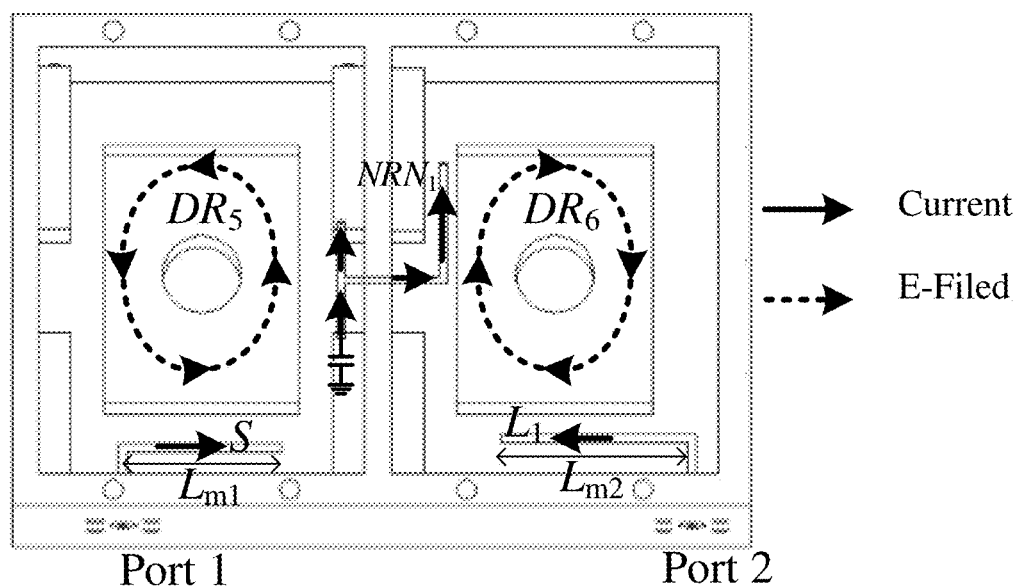
FIG. 10A shows a circuitry structure of the filter 1 shown in FIG. 9B.

Since Filter 2 is OFF, it can be ignored. The equivalent structure is shown in FIG. 10A, which only includes Filter 1. When the PIN diode in the first coupling line structure $NRN_1$ is off, the ends of the two branch lines in the first coupling line structure $NRN_1$ are open-circuited and short-circuited. Thus, the first coupling line structure $NRN_1$ is the same as that of Type II discussed above. The coupling between the first coupling line structure $NRN_1$ and the fifth dielectric resonator $DR_5$ is non-zero and can be controlled. In this case, Filter 1 is the same as the conventional BPF with the topology shown in FIG. 10B. Desired passband responses can be realized by using filter design theory. Due to the cross coupling between the first input and output feeding line S and the first coupling line structure $NRN_1$ as well as between the first coupling line structure $NRN_1$ and the first output feeding line $L_1$, two transmission zeros can be generated with the mechanism analyzed below.

In the analysis of transmission zeros, the phase shift generated by the electric and magnetic coupling can be considered as 90° and −90°, respectively. As shown in FIG. 10A, the first input feeding line S with the open end provides electric coupling to the fifth dielectric resonator $DR_5$. Thus, the phase shift from the first input feeding line S to the fifth dielectric resonator $DR_5$ is 90°. Two branch lines in the first coupling line structure $NRN_1$ with open and short ends are coupled to the fifth dielectric resonator $DR_5$. Since the short end induces strong magnetic field, the coupling between the fifth dielectric resonator $DR_5$ and the first coupling line structure $NRN_1$ is magnetic coupling, namely, the phase shift from the fifth dielectric resonator $DR_5$ to the first coupling line structure $NRN_1$ is −90°. Similarly, the phase shifts from the first input feeding line S to the first coupling line structure $NRN_1$, from the first coupling line structure $NRN_1$ to the sixth dielectric resonator $DR_6$, from the sixth dielectric resonator $DR_6$ to the first output feeding line $L_1$ and from the first coupling line structure $NRN_1$ to the first output feeding line $L_1$ are all analyzed to be 90°. For the fifth dielectric resonator $DR_5$ and the sixth dielectric resonator $DR_6$, they induce 0° phase shift at the resonant frequency.

However, they are equivalent to the capacitor and inductor at the frequencies lower and higher than the passband, which provides 90° and −90° phase shifts, respectively.

Figure 10B:
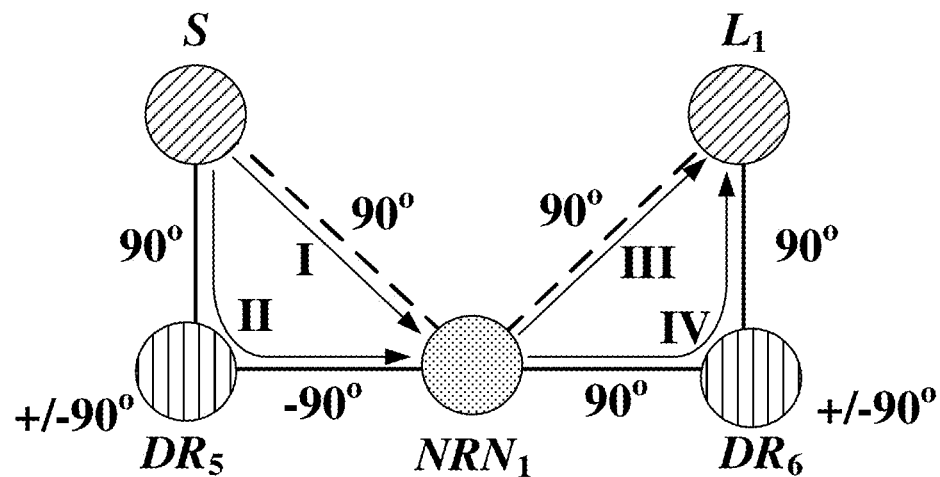
FIG. 10B shows a topology structure of the filter 1 shown in FIG. 9B.

Based on the above analysis, the phase relationship can be shown as FIG. 10B. There are two transmission paths from the first input feeding line S to the first coupling line structure $NRN_1$, namely, Path I and Path II. At the frequency higher than the passband, the phase shift of each path can be expressed as $$90° \text{ Path II: } 90°+(90°)+(90°)=-90° \quad \text{Path I}$$

As indicated above, the signals transmitted from Path 1 and Path II are out-of-phase. If their magnitudes are the same at a specific frequency, signals from the two paths can be offset, resulting in a transmission zero. Similarly, the phase shifts at the frequency lower than the passband from Path I and Path II are found to be 90°. Thus, no transmission zero can be generated. As for the circuitry structure of the first coupling line structure, the sixth dielectric resonator $DR_6$ and the first output feeding line $L_2$, it is found that a transmission zero can be generated at the frequency lower than the passband. Thus, for the Filter 1, two transmission zeros can be generated at both sides of the passband, which enhance the roll-off rate.

Figure 11A:
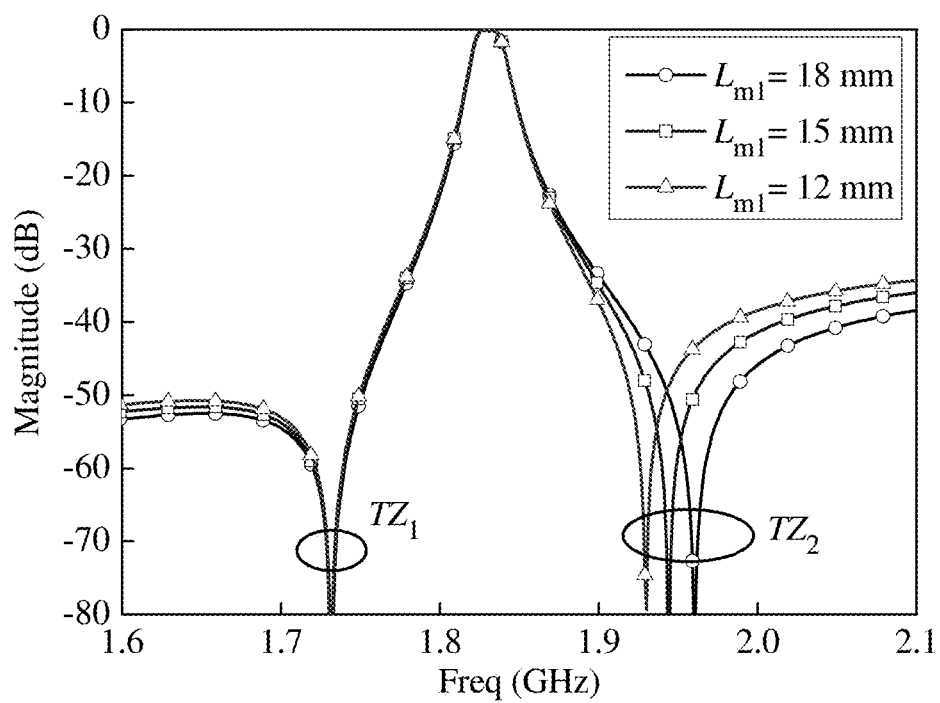
FIG. 11A shows simulations of the filter 1 shown in FIG. 9B with different locations of the second transmission zero.
Figure 11B:
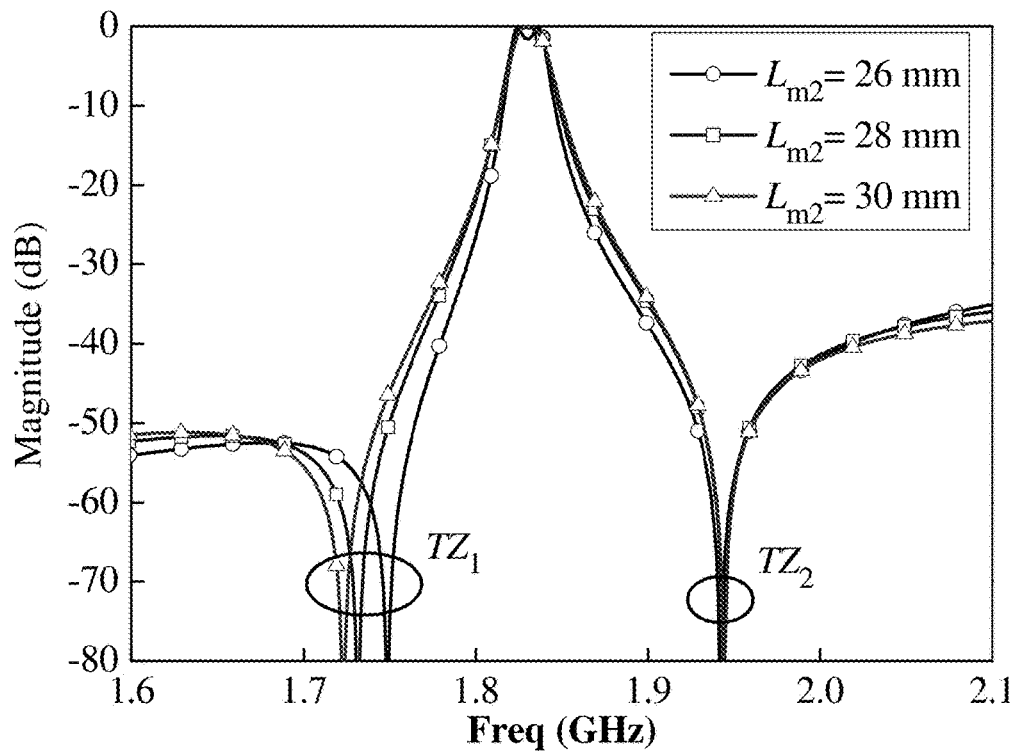
FIG. 11B shows simulations of the filter 1 shown in FIG. 9B with different locations of the first transmission zero.

For demonstration, simulations are carried out and the results are shown in FIG. 11A-11B. It is observed that two transmission zeros ($TZ_1$ and $TZ_2$) appear at both the passband edges, which verifies the analysis. For further validation, the length of the input feeding line $L_{m1}$ is changed, namely, changing the coupling strength between the first input feeding line S and the fifth dielectric resonator $DR_5$ and that between the first input feeding line S and the first output feeding line $L_1$. It is found that $L_{m1}$ only has impact on the location of $TZ_2$, as shown in FIG. 11A. Besides, FIG. 11B shows the length of the output feeding line $L_{m2}$ can alter the location of transmission zero $TZ_1$ with transmission zero $TZ_2$ fixed. Accordingly, it can be concluded that transmission zeros $TZ_1$ and $TZ_2$ are generated by the cross coupling from the coupling line structures to the first input feeding line S and the first output feeding line $L_1$.

Figure 12:
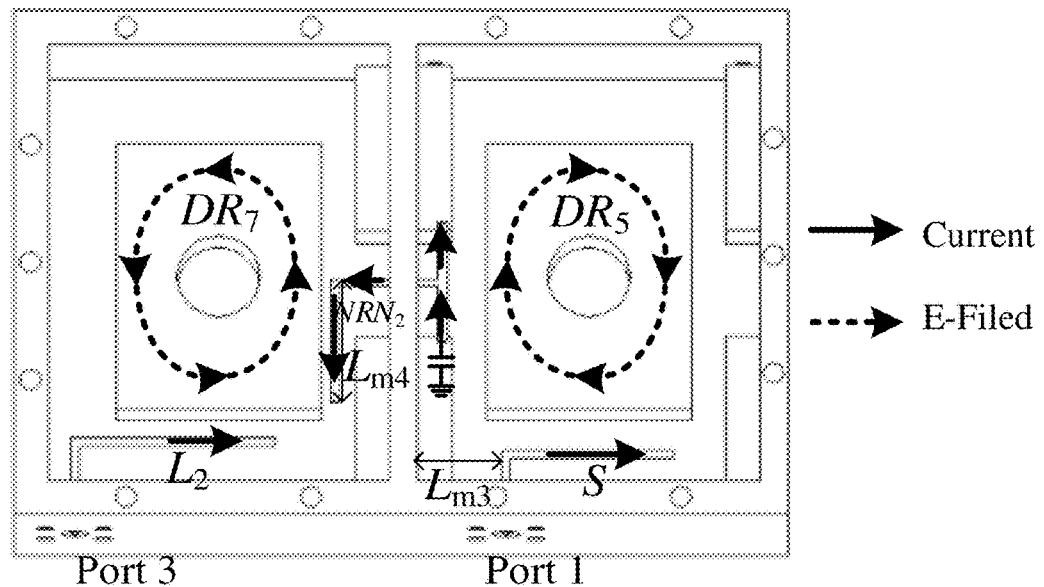
FIG. 12 shows a circuitry structure of the filter 2 shown in FIG. 9B.

When the PIN diode in the first coupling line structure $NRN_1$ is on and that in the second coupling line structure $NRN_2$ is off, the single-pole double-throw filtering switch based on dielectric resonator is in state 2, namely, Filter 1 is OFF and Filter 2 is ON. Similar to State 1, high isolation between the first input feeding line S and the first output feeding line $L_1$ as well as the first output feeding line $L_1$ and the second output feeding line $L_2$ is realized. And Filter 2 is the same as the conventional BPF. Its structure is shown in FIG. 12. The desired bandpass responses can be realized by the filter design theory. Similar to the Filter 1 in State 1, cross coupling from the coupling line structures to source and load is also used in Filter 2 to generate transmission zeros for skirt selectivity enhancement.

Figure 13A:
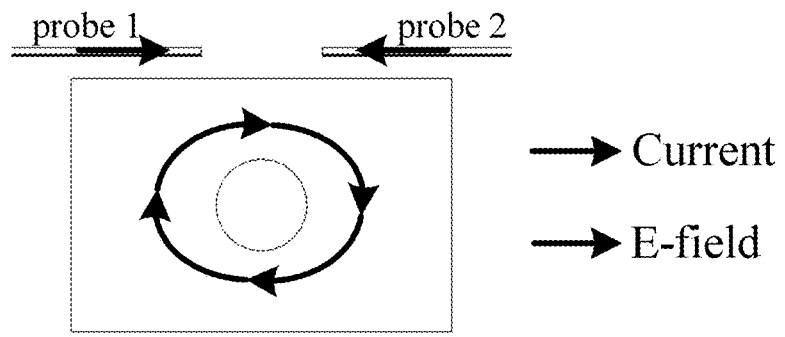
FIG. 13A shows two types coupling between the metal probe and the dielectric resonator.
Figure 13B:
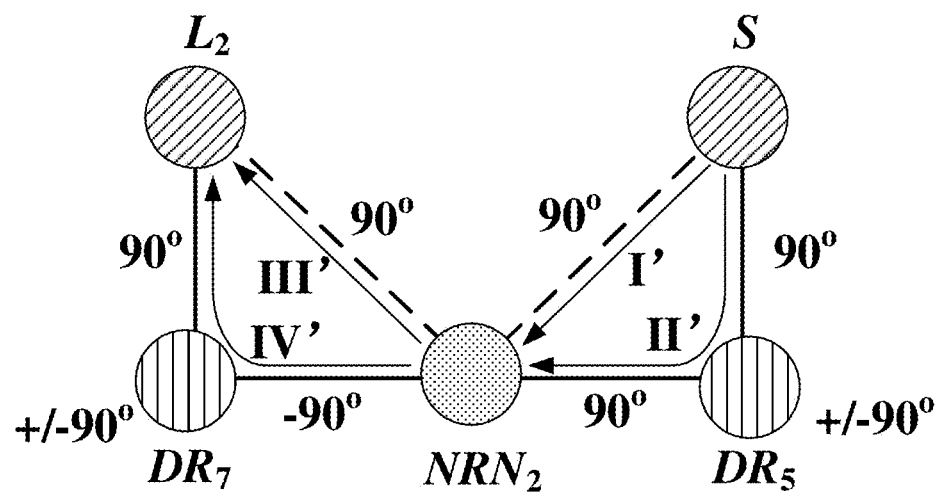
FIG. 13B shows topology of filter 2 shown in FIG. 9B with the phase shift characteristic.
Figure 14A:
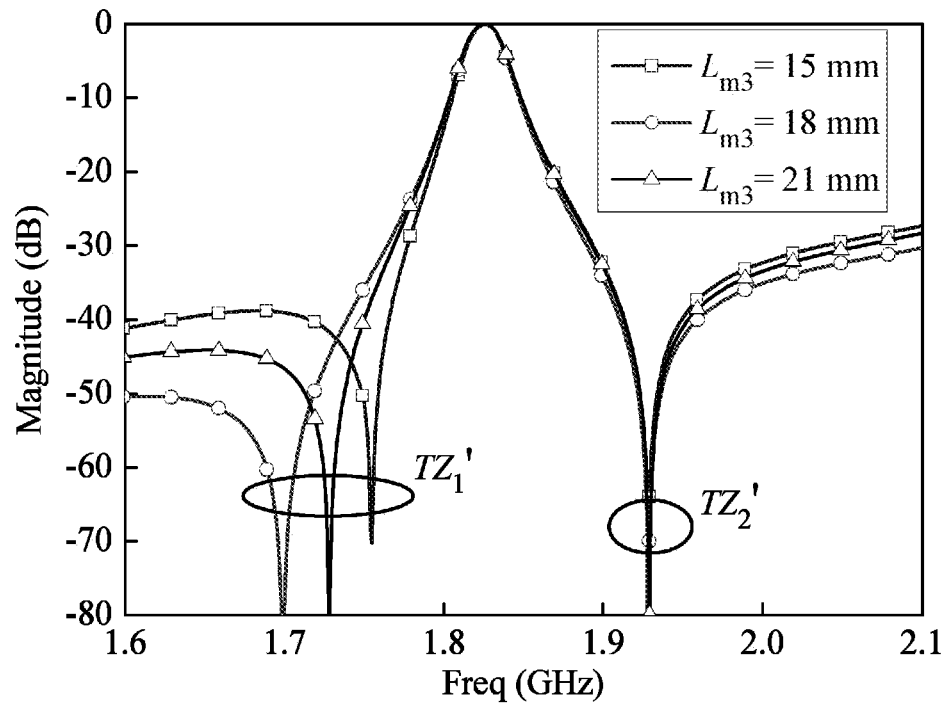
FIG. 14A shows simulations of the filter 2 shown in FIG. 9B with different locations of a first transmission zero.
Figure 14B:
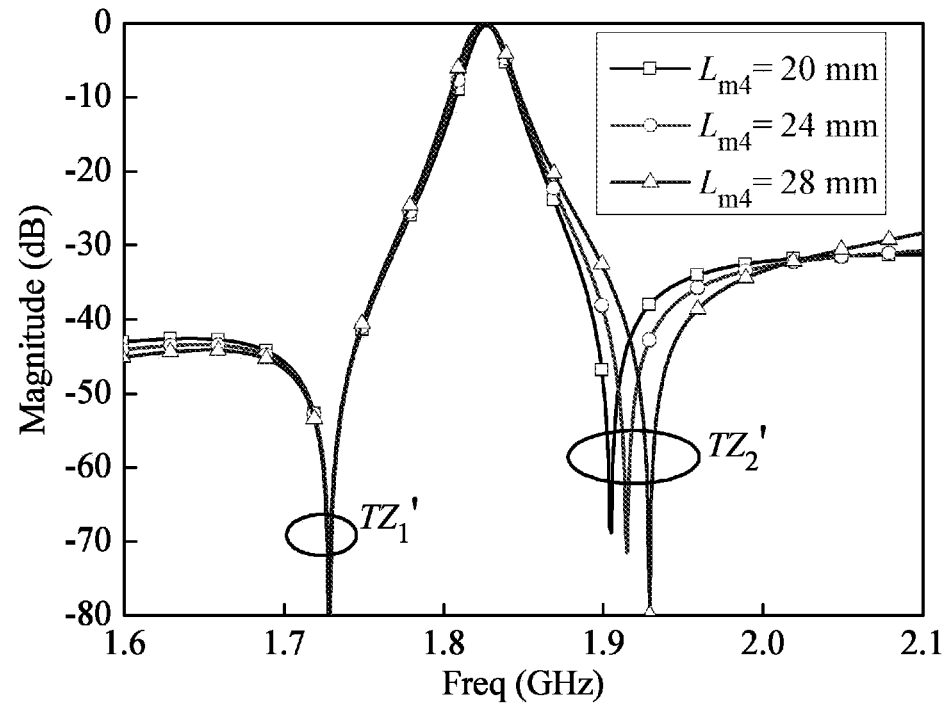
FIG. 14B shows simulations of the filter 2 shown in FIG. 9B with different locations of a second transmission zero.

For analyzing the transmission zeros, the phase shift characteristic in Filter 2 is also discussed. A coupling scheme is presented in FIG. 13A. The current on the metal probe 1 and the E-field generated by the dielectric resonator are in-phase. It is known that the coupling between the dielectric resonator and the metal probe 1 is electric coupling and thus the phase shift is 90°. However, the current on the metal probe 2 and the E-field in the dielectric resonator are out-of-phase. The coupling between the metal probe 2 and the dielectric resonator is also electric coupling, but there exists extra 180° phase shift caused by the out-of-phase field distribution. Thus, the total phase shift should be expressed as −90° (or 270°). Based on this, the topology of Filter 2 with the phase shift characteristic is shown in FIG. 13B. By introducing the same analysis method discussed above, it can be known that two transmission zeros close to the passband can be generated by the cross coupling from the first input feeding line S to the second coupling line structure $NRN_2$ and from the second coupling line structure $NRN_2$ to the first output feeding line $L_2$. For demonstration, simulations of Filter 2 with different coupling strength are carried out and the results are shown in FIG. 14A-14B. It is seen that two transmission zeros can be found at both sides of the passband. Meanwhile, by controlling the coupling strength in the structures from the first input feeding line S to the second coupling line structure $NRN_2$ (or from the second coupling line structure $NRN_2$ to the second output feeding line $L_2$), the location of the transmission zero $TZ_1'$ (or $TZ_2'$) can be changed with the other fixed, which verifies the analysis.

Figure 15A:
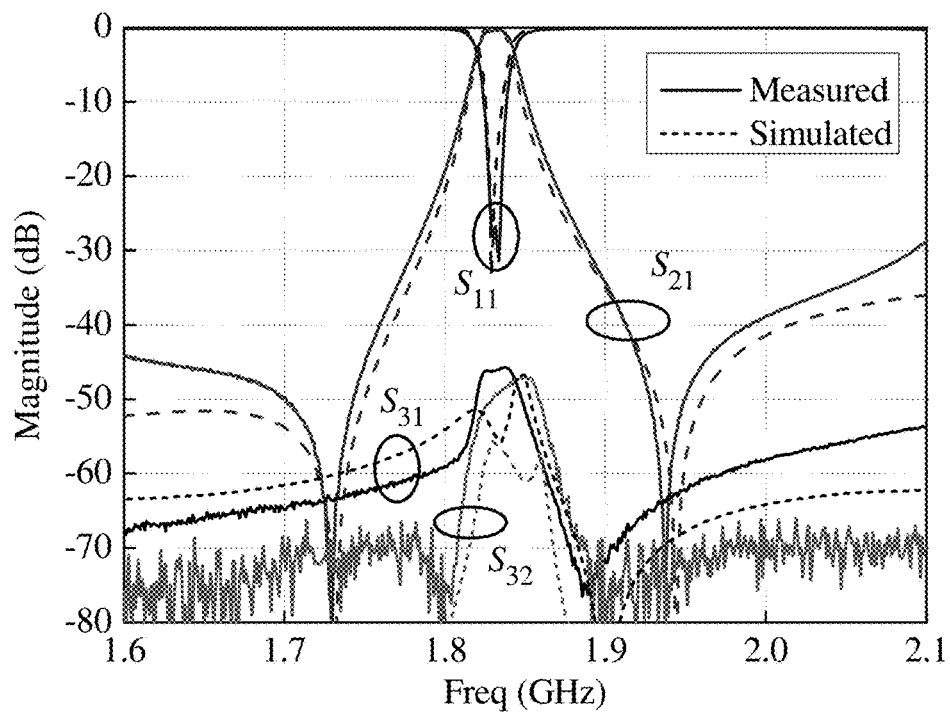
FIG. 15A shows simulated and measured results of the first state of the single-pole double-throw filtering switch based on dielectric resonator shown in FIG. 9A.
Figure 15B:
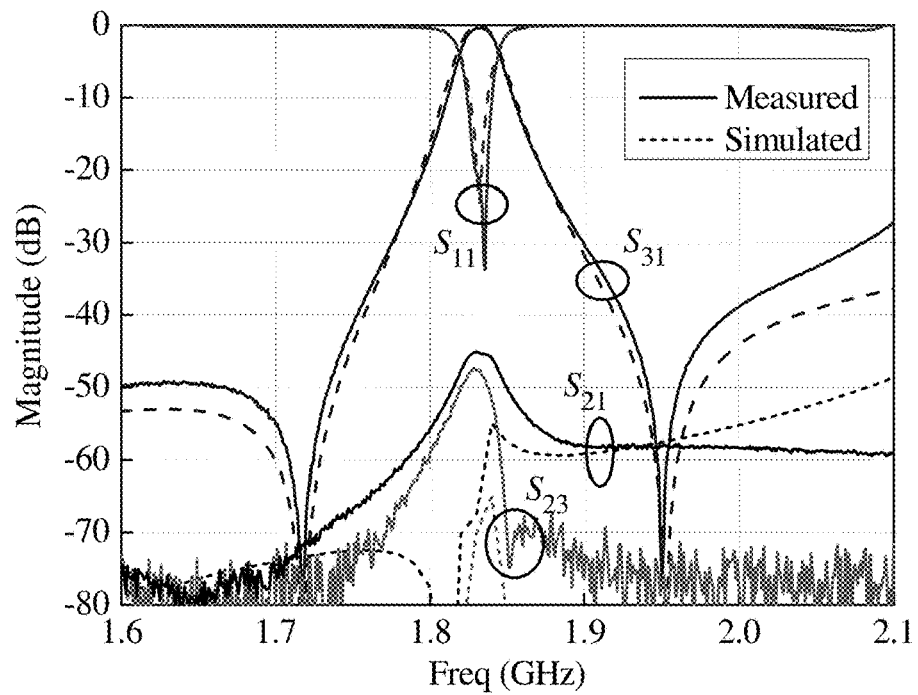
FIG. 15B shows simulated and measured results of the second state of the single-pole double-throw filtering switch based on dielectric resonator shown in FIG. 9A.

For verifying the proposed concept, the simulated and measured results of different states of the single-pole double-throw filtering switch based on dielectric resonator in the present application are shown in FIG. 15A-15B, which exhibit good agreement.

When the Filter 1 is ON and Filter 2 is OFF, the Filter 1 exhibits good filtering responses while filter 2 is highly isolated, As shown in FIG. 15A. The measured passband of Filter 1 is centered at 1.831 GHz with the 3-dB FBW of 1.28%. The return loss is better than 25 dB and the insertion loss is 0.39 dB at the centered frequency of the passband. Two transmission zeros appear at 1.73 and 1.937 GHz, which greatly enhance skirt selectivity. As for the Filter 2 in OFF-state, the suppression levels are better than 45 dB between port 1 and port 3 ($S_{31}$) within the frequency range from 1.6 to 2.1 GHz. Meanwhile, isolation between port 2 and port 3 ($S_{32}$) is higher than 47 bathe input $P_{1dB}$ is larger than 49 dBm.

When Filter 1 is OFF and Filter 2 is ON, Filter 1 shows high isolation performance and Filter 2 exhibits good filtering responses, as shown in FIG. 15B. The measured passband of Filter 2 is centered at 1.831 GHz with the 3-dB FBW of 1.3%. The return loss is better than 20 dB and the in-band insertion loss is 0.4 dB. Two transmission zeros are generated at 1.718 and 1.95 GHz, resulting in high skirt selectivity. For the isolation between port 2 and port 1 or 3, $S_{21}$ and $S_{23}$ are better than 45 and 47 dB, respectively, within the frequency range from 1.6 to 2.1 GHz.

To sum up, the present application has disclosed a filtering switch using dielectric resonator based on coupling control. EM fields of the rectangular dielectric resonator and T-shape feeding line structure have been theoretically analyzed and utilized to guide the coupling control. The single-pole double-throw filtering switch and the single-pole single-throw switches based on dielectric resonator have been implemented. The results have shown low ON-state loss, high power capability and high OFF-state isolation. Transmission zeros are generated at both sides of the passband by cross coupling between dielectric resonators or between feeding line structures and coupling line structures, resulting in high skirt selectivity. Comparison with some other works has been given to show the advantages of lower ON-state loss, higher power handling capability and higher OFF-state isolation. With these features, the proposed filtering switches are suitable for the high-power TDD systems.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present application pertains without departing from its spirit and scope. Accordingly, the scope of the present application is defined by the appended claims rather than the foregoing description and the exemplary embodiments described therein.

What is claimed is:

1. A filtering switch based on dielectric resonator comprising a dielectric resonator, a metal cavity in which the dielectric resonator is located, a switch circuitry and a feeding line structure; wherein the feeding line structure includes an input feeding line structure and an output feeding line structure having the same structure placed at different sides of the dielectric resonator, the input feeding line structure and the output feeding line structure each comprises two branch lines and a main line, wherein the two branch lines which are perpendicular to the main line at the center are connected at both ends of the main line, one end of one branch line is connected to the metal cavity and grounded, while one end of the other branch line is connected to the switch circuitry for controlling the turning on and off of the switch circuit, such that ON- and OFF-states of the filtering switch based on dielectric resonator are realized by controlling a coupling between the dielectric resonator and the feeding line structure.

2. The filtering switch based on dielectric resonator according to claim 1, wherein when one dielectric resonator presents, the input feeding line structure and the output feeding line structure are located at both sides of one dielectric resonator.

3. The filtering switch based on dielectric resonator according to claim 1, wherein when two or more dielectric resonators present, the input feeding line structure and the output feeding line structure are located one side of different dielectric resonators.

4. The filtering switch based on dielectric resonator according to claim 3, a metal probe is placed between the dielectric resonators for electrical cross coupling.

5. The filtering switch based on dielectric resonator according to claim 1, wherein the switch circuitry is integrated into a PCB which is embedded in the metal cavity.

6. The filtering switch based on dielectric resonator according to claim 5, wherein the switch circuitry includes a capacitor, a PIN diode and a resistor, wherein the other end of the other branch line is connected to a positive electrode of the PIN diode via the capacitor, the negative electrode of the PIN diode is grounded, one end of the resistor is connected between the capacitor and the PIN diode, and the other end the resistor is connected to a DC power supply.

7. The filtering switch based on dielectric resonator according to claim 1, wherein a hole is dug at a center of the dielectric resonator to separate different resonant modes.

8. The filtering switch based on dielectric resonator according to claim 7, wherein a tuning disk for adjusting resonant frequency is installed above the dielectric resonator.

9. The filtering switch based on dielectric resonator according to claim 8, wherein numbers of the hole and the tuning disk are the same as a number of the dielectric resonators.

10. The filtering switch based on dielectric resonator according to claim 1, wherein, the dielectric resonator has a symmetric structure comprising a rectangle structure or a cylindrical structure.

11. A filtering switch based on dielectric resonator comprising a first dielectric resonator, a second dielectric resonator, a third dielectric resonator, a fourth dielectric resonator, a metal cavity, a switch circuitry and a feeding line structure; wherein the feeding line structure includes an input feeding line structure placed at a side of the first dielectric resonator and an output feeding line structure placed at a side of the fourth dielectric resonator; the input feeding line structure and the output feeding line structure each consists of two branch lines and a main line, wherein the two branch lines which are perpendicular to the main line at the center are connected at both ends of the main line; one end of one branch line in the input feeding line structure is connected to the metal cavity and grounded, and one end of the other branch line in the input feeding line structure is connected to the switch circuitry in the metal cavity; one end of one branch line in the output feeding line structure is connected to the metal cavity and grounded, and one end of the other branch line in the output feeding line structure is connected to the switch circuitry in the metal cavity for controlling the turning on and off of the switch circuitry, such that the ON- and OFF-states of the filtering switch based on dielectric resonator are realized by controlling the coupling between dielectric resonators and the feeding line structure.

12. A filtering switch based on dielectric resonator comprising a metal cavity, a fifth dielectric resonator, a sixth dielectric resonator, a seventh dielectric resonator, a switch circuitry, a first coupling line structure and a second coupling line structure, wherein the seventh dielectric resonator, the fifth dielectric resonator, and the sixth dielectric resonator are arranged in the metal cavity one after another, the first coupling line structure is placed between the fifth dielectric resonator and the sixth dielectric resonator, while the second coupling line structure is placed between the fifth dielectric resonator and the seventh dielectric resonator, both of the first coupling line structure and the second coupling line structure comprise a main coupling line, a first branch coupling line, and a second branch coupling line, one end of the first branch coupling line and the second branch coupling line is connected to both ends of the main coupling line and perpendicular to the main coupling line, the other end of the first branch coupling line is grounded while the other end of the second branch coupling line is connected to the switch circuitry, the first branch coupling lines and the second branch coupling lines are coupled to the fifth dielectric resonator, the main line of the first coupling line structure is coupled to the sixth dielectric resonator, the main line of the second coupling line structure is coupled to the seventh dielectric resonator.

13. The filtering switch based on dielectric resonator according to claim 12, wherein the main coupling line has a bended structure which is consisted of a transverse line and a vertical line which are perpendicular to each other, wherein the transverse line is connected to the one end of the first branch coupling line and the second branch coupling line.

14. The filtering switch based on dielectric resonator according to claim 12, wherein further comprising a first input feeding line arranged at one side of the fifth dielectric resonator, a first output feeding line arranged at one side of the sixth dielectric resonator, and a second output feeding line arranged at one side of the seventh dielectric resonator.

15. The filtering switch based on dielectric resonator according to claim 12, wherein the other end of the first branch coupling line is connected to the paralleled inductor and capacitor and then grounded.

16. The filtering switch based on dielectric resonator according to claim 12, wherein the switch circuitry includes a capacitor, a PIN diode and a resistor, wherein the other end of the second branch line is connected to a positive electrode of the PIN diode via the capacitor, the negative electrode of the PIN diode is grounded, one end of the resistor is connected between the capacitor and the PIN diode, and the other end the resistor is connected to a DC power supply.

17. The filtering switch based on dielectric resonator according to claim 12, wherein a hole is dug at a center of at least one of the fifth dielectric resonator, the sixth dielectric resonator and the seventh dielectric resonator to separate different resonant modes.

18. The filtering switch based on dielectric resonator according to claim 17, wherein a tuning disk for adjusting resonant frequency is installed above at least one of the fifth dielectric resonator, the sixth dielectric resonator and the seventh dielectric resonator to adjust the resonant frequency.

19. The filtering switch based on dielectric resonator according to claim 18, wherein the numbers of the hole and the tuning disk are all three.

20. The filtering switch based on dielectric resonator according to claim 12, wherein, the dielectric resonator has a symmetric structure comprising a rectangle structure or a cylindrical structure.

\* \* \* \* \*